(12) United States Patent
Goosen et al.

(10) Patent No.: US 12,165,836 B2
(45) Date of Patent: Dec. 10, 2024

(54) SYSTEMS AND METHODS OF PROFILING CHARGED-PARTICLE BEAMS

(71) Applicant: ASML NETHERLANDS B.V., Veldhoven (NL)

(72) Inventors: Maikel Robert Goosen, Eindhoven (NL); Erwin Paul Smakman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 274 days.

(21) Appl. No.: 17/770,043

(22) PCT Filed: Oct. 15, 2020

(86) PCT No.: PCT/EP2020/078976
§ 371 (c)(1),
(2) Date: Apr. 18, 2022

(87) PCT Pub. No.: WO2021/074260
PCT Pub. Date: Apr. 22, 2021

(65) Prior Publication Data
US 2022/0392741 A1    Dec. 8, 2022

(30) Foreign Application Priority Data
Oct. 18, 2019    (EP) .................................. 19203966

(51) Int. Cl.
*H01J 37/22*    (2006.01)
*H01J 37/244*    (2006.01)
(Continued)

(52) U.S. Cl.
CPC ............ *H01J 37/265* (2013.01); *H01J 37/22* (2013.01); *H01J 37/244* (2013.01); *H01J 37/28* (2013.01);
(Continued)

(58) Field of Classification Search
CPC ........ H01J 37/265; H01J 37/22; H01J 37/244; H01J 37/28; H01J 2237/2448; H01J 2237/24542; H01J 2237/2482
See application file for complete search history.

(56) References Cited

U.S. PATENT DOCUMENTS 11,101,101 B2 *    8/2021    Buijsse ............... H01J 37/1472
11,849,530 B2 *    12/2023   Hirshfield ................ H05H 7/02
(Continued)

FOREIGN PATENT DOCUMENTS

CN    109979793 A    7/2019
TW    201225148 A    6/2012
(Continued)

OTHER PUBLICATIONS

J.H.M. Kanters' Master's Thesis—"Electron Bunch length measurement using the ponderomotive force of a laser standing wave," 2011, Eindhoven University of Technology.
(Continued)

*Primary Examiner* — David P Porta
*Assistant Examiner* — Fani Polyzos Boosalis
(74) *Attorney, Agent, or Firm* — Finnegan, Henderson, Farbow, Garrett & Dunner, LLP

(57) ABSTRACT

Systems and methods of profiling a charged-particle beam are disclosed. The method of profiling a charged-particle beam may comprise activating a charged-particle source to generate the charged-particle beam along a primary optical axis, modifying the charged-particle beam by adjusting an interaction between the charged-particle beam and a standing optical wave, detecting charged particles from the modified charged-particle beam after the interaction with the standing optical wave, and determining a profile of the charged-particle beam based on the detected charged particles. Alternatively, the method may include activating an
(Continued)

optical source, modifying the optical beam by adjusting an interaction between the optical beam and a charged-particle beam, detecting an optical signal from the modified optical beam, and determining a characteristic of the charged-particle beam based on the detected optical signal.

20 Claims, 8 Drawing Sheets

(51) Int. Cl.
    *H01J 37/26*     (2006.01)
    *H01J 37/28*     (2006.01)
(52) U.S. Cl.
    CPC ............ *H01J 2237/2448* (2013.01); *H01J 2237/24542* (2013.01); *H01J 2237/2482* (2013.01)

(56) References Cited

U.S. PATENT DOCUMENTS

| | | | |
|---|---|---|---|
| 2011/0220791 A1* | 9/2011 | Reed | H01J 37/26 250/311 |
| 2018/0286631 A1 | 10/2018 | Axelrod et al. | |
| 2019/0122855 A1 | 4/2019 | Nagatani | |

FOREIGN PATENT DOCUMENTS

| | | |
|---|---|---|
| TW | 201519257 A | 5/2015 |
| WO | WO 2010/042629 A2 | 4/2010 |

OTHER PUBLICATIONS

H. Batelaan, "Illuminating the Kapitza-Dirac Effect with Electron Matter Optics," Reviews of Modern Physics, vol. 79, Jul.-Sep. 2007.

Xiaofeng Li et al., "Theory of the Kapitza-Dirac Diffraction Effect," Physical Review Letters, vol. 92, No. 23.

Daniel L. Freimund et al., "Bragg scattering of free electrons using the Kapitza-Dirac effect," Physical Review Letters, vol. 89, No. 28.

M. Kozák et al., "Inelastic ponderomotive scattering of electrons at a high-intensity optical travelling wave in vacuum," Nature Physics, DOI:10.1038/NPHYS4282.

Office Action issued by the Intellectual Property Office (IPO) relating to ROC (Taiwan) Patent Application No. 109135636, mailed Sep. 14, 2021.

International Search Report and Written Opinion received from the International Search Authority issued in related International Application No. PCT/EP2020/078976, mailed Feb. 8, 2021.

\* cited by examiner

SYSTEMS AND METHODS OF PROFILING CHARGED-PARTICLE BEAMS

CROSS-REFERENCE TO RELATED APPLICATIONS

This application claims priority to International Application No. PCT/EP2020/078976, filed Oct. 15, 2020, and published as WO 2021/074260 A1, which claims priority of EP application Ser. No. 19/203,966.7 which was filed on Oct. 18, 2019. The contents of these applications are incorporated herein by reference in their entireties.

TECHNICAL FIELD

The embodiments provided herein disclose a charged-particle beam apparatus, and more particularly an electron microscope with enhanced imaging resolution by profiling the electron beam using optical fields.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more important, and therefore enhanced imaging resolution may be desired. Although electron beam profiles are measured, the measurement involves interaction of electron beams with the sample, which may affect the ability to isolate contributing factors from the sample, thereby limiting the imaging resolution desired for reliable defect detection and analysis.

SUMMARY

One aspect of the present disclosure is directed a method of profiling a charged-particle beam. The method may comprise activating a charged-particle source to generate the charged-particle beam along a primary optical axis, modifying the charged-particle beam by adjusting an interaction between the charged-particle beam and a standing optical wave, detecting, using a charged-particle detector, charged particles from the modified charged-particle beam after the interaction with the standing optical wave, and determining a characteristic of the charged-particle beam based on the detected charged particles. The method may further comprise generating, using an optical source, the standing optical wave in a plane perpendicular to the primary optical axis. Modifying the charged-particle beam may comprise modifying a path, a position, a size, or an intensity of the charged-particle beam. Modifying the size of the charged-particle beam may comprise one of magnifying or truncating the charged-particle beam. Adjusting the interaction may comprise adjusting a position of a secondary optical axis of the standing optical wave in relation to the primary optical axis. Adjusting the interaction may further comprise causing the charged-particle beam to interact with the standing optical wave or causing a change in the interaction between the charged-particle beam and the standing optical wave, wherein causing the change in the interaction may comprise changing from substantially no interaction to interaction between the charged-particle beam and the standing optical wave. The method may further comprise adjusting the position of the secondary optical axis to intersect with the primary optical axis, and wherein adjusting the position of the secondary optical axis to intersect with the primary optical axis causes magnification of the charged-particle beam. Adjusting the position of the secondary optical axis may further comprise displacing the standing optical wave such that the secondary optical axis intersects with a portion of a periphery of the charged-particle beam, and wherein displacing the standing optical wave to intersect the secondary optical axis with the portion of the periphery of the charged-particle beam causes truncation of the charged-particle beam.

The charged-particle detector may be disposed substantially coplanar with a sample configured to receive the charged-particle beam and may comprise a scintillator, a pixelated scintillator, a charge-coupled device, a faraday cup, a spectrometer, or an electron capture detector. Determining the characteristic may comprise determining a profile of the charged-particle beam.

Another aspect of the present disclosure is directed to a charged-particle beam system to profile a charged-particle beam. The system may comprise a charged-particle source to generate a charged-particle beam along a primary optical axis, an optical source configured to generate a standing optical wave along a secondary optical axis, and a controller. The controller may include circuitry and be configured to activate the optical source to generate the standing optical wave, adjust an interaction between the charged-particle beam and the standing optical wave to modify the charged-particle beam, activate a charged-particle detector to detect charged particles from the modified charged-particle beam after the interaction with the standing optical wave, and determine a characteristic of the charged-particle beam based on the detected charged particles. The optical source may be further configured to generate the standing optical wave in a plane perpendicular to the primary optical axis.

Modification of the charged-particle beam may comprise modification of a path, a position, a size, or an intensity of the charged-particle beam. Modification of the size of the charged-particle may comprise magnification or truncation of the charged-particle beam. Adjustment of the interaction may comprise adjustment of a position of the secondary optical axis in relation to the primary optical axis. The position of the secondary optical axis may be adjusted to intersect with the primary optical axis, wherein adjustment of the secondary optical axis to intersect with the primary optical axis causes magnification of the charged-particle beam. Adjustment of the position of the secondary optical axis further comprises displacing the standing optical wave such that the secondary optical axis intersects with a portion of a periphery of the charged-particle beam, wherein displacement of the standing optical wave to intersect the secondary optical axis with the portion of the periphery of the charged-particle beam causes truncation of the charged-particle beam. Adjustment of the interaction may further comprise adjustment of the position of the secondary optical axis to cause the charged-particle beam to interact with the standing optical wave, or adjustment of the position of the secondary optical axis to cause a change in the interaction between the charged-particle beam and the standing optical wave, wherein the change in the interaction comprises a change from substantially no interaction to interaction between the charged-particle beam and the standing optical wave.

The charged-particle detector may be disposed substantially coplanar with a sample configured to receive the charged-particle beam and may comprise a scintillator, a pixelated scintillator, a charge-coupled device, a faraday cup, a spectrometer, or an electron capture detector. The charged-particle detector may be disposed between an objective lens and a sample configured to receive the charged-particle beam. Determination of the characteristic comprises determination of a profile of the charged-particle beam.

Another aspect of the present disclosure is directed to a method of profiling a charged-particle beam. The method may comprise activating an optical source to generate an optical beam, modifying the optical beam by adjusting an interaction between the optical beam and the charged-particle beam generated by a charged-particle source, detecting, using an optical detector, an optical signal from the modified optical beam after the interaction with the charged-particle beam, and determining a characteristic of the charged-particle beam based on the detected optical signal. The method may further comprise activating a charged-particle source to generate the charged-particle beam along a primary optical axis, and directing the optical beam along a secondary optical axis in a first plane perpendicular to the primary optical axis.

Modifying the optical beam may comprise modifying a path, a position, a size, or an intensity of the optical beam and wherein modifying the size of the optical beam comprises magnification or truncation of the optical beam. The method may further comprise scanning the charged-particle beam through the optical beam along a second plane perpendicular to a secondary optical axis of the optical beam and to adjust the interaction between the optical beam and the charged-particle beam. Scanning the charged-particle beam may comprise adjusting a position of the primary optical axis of the charged-particle beam in relation to the secondary optical axis. Adjusting the interaction further comprises causing the optical beam to interact with the charged-particle beam or causing a change in the interaction between the optical beam and the charged-particle beam, wherein causing the change in the interaction comprises changing from substantially no interaction to interaction between the optical beam and the charged-particle beam. Scanning the charged-particle beam may further comprise adjusting the position of the primary optical axis to intersect with the secondary optical axis. Adjusting the position of the primary optical axis to intersect with the secondary optical axis may cause magnification of the optical beam. Scanning the charged-particle beam may further comprise adjusting the position of the primary optical axis to intersect with a periphery of the optical beam, wherein adjusting the position of the primary optical axis of the charged-particle beam to intersect with a periphery of the optical beam causes truncation of the optical beam. A position of the optical source is adjustable in the first plane. A position of the optical detector is adjustable in the first plane and configured to detect the optical signal from the modified optical beam after interaction with the charged-particle beam. Determining the characteristic may comprise determining a profile of the charged-particle beam.

Another aspect of the present disclosure is directed to a charged-particle beam system. The system may comprise a charged-particle source to generate a charged-particle beam along a primary optical axis, an optical source configured to generate an optical beam along a secondary optical axis, and a controller. The controller may include circuitry and be configured to activate the optical source to generate the optical beam, adjust an interaction between the charged-particle beam and the optical beam to modify the optical beam, activate an optical detector to detect an optical signal from the modified optical beam after the interaction with the charged-particle beam, and determine a profile of the charged-particle beam based on the detected optical signal.

Adjustment of the interaction further comprises adjustment of a position of the secondary optical axis to cause the optical beam to interact with the charged-particle beam or adjustment of the position of the secondary optical axis to cause a change in the interaction between the optical beam and the charged-particle beam, wherein the change in the interaction comprises a change from substantially no interaction to interaction between the optical beam and the charged-particle beam.

Another aspect of the present disclosure is directed to a multi-beam apparatus. The multi-beam apparatus may comprise a controller including circuitry. The controller may be configured to activate a charged-particle source to generate a primary charged-particle beam and to form a plurality of charged-particle beams therefrom; activate an optical source to generate a plurality of optical beams; adjust an interaction between at least one of the plurality of optical beams and one of the plurality of charged-particle beams to modify the at least one of the plurality of optical beams; activate an optical detector to detect an optical signal from the at least one of the plurality of optical beams modified after the interaction with one of the plurality of charged-particle beams; and reconstruct the optical signal to determine a profile of the one of the plurality of charged-particle beams.

The optical source may comprise an array of laser diodes. The optical detector may comprise a photodetector, an array of photodetectors, or an array of photomultiplier tubes. A photodetector of the array of photodetectors may be associated with a laser diode of the array of laser diodes. Modification of the at least one of the plurality of optical beams may comprise modification of a path, a position, a size, or an intensity of the at least one of the plurality of optical beams. Modification of the size of the at least one of the plurality of optical beams may comprise magnification or truncation of the at least one of the plurality of optical beams. The optical detector and the optical source may be disposed radially in a plane perpendicular to a primary optical axis of the primary charged-particle beam. The optical detector may be configured to receive the plurality of optical signals generated by the interaction of the plurality of optical beams and the plurality of charged-particle beams.

Another aspect of the present disclosure is directed to a non-transitory computer readable medium storing a set of instructions that is executable by one or more processors of a charged particle beam apparatus to cause the charged particle beam apparatus to perform a method of profiling a charged-particle beam. The method may comprise activating a charged-particle source to generate the charged-particle beam along a primary optical axis; modifying the charged-particle beam by adjusting an interaction between the charged-particle beam and a standing optical wave; activating a charged-particle detector to detect charged particles from the modified charged-particle beam after the interaction with the standing optical wave; and determining a profile of the charged-particle beam based on the detected charged particles. Adjusting the interaction may further comprise adjusting a position of a secondary optical axis of the standing optical wave in relation to the primary optical axis, wherein adjusting the position of the secondary optical axis to intersect with the primary optical axis causes magnification of the charged-particle beam; and displacing the standing optical wave to intersect the secondary optical axis with a portion of a periphery of the charged-particle beam causes truncation of the charged-particle beam.

Another aspect of the present disclosure is directed to a non-transitory computer readable medium storing a set of instructions that is executable by one or more processors of a charged particle beam apparatus to cause the charged particle beam apparatus to perform a method of profiling a charged-particle beam. The method may comprise activating an optical source to generate an optical beam; modifying the optical beam by adjusting an interaction between the optical beam and the charged-particle beam generated by a charged-particle source; detecting, using an optical detector, an optical signal from the modified optical beam after the interaction with the charged-particle beam; and determining a profile of the charged-particle beam based on the detected optical signal. Profiling the charged-particle beam may further comprise scanning the charged-particle beam through the optical beam to adjust the interaction between the optical beam and the charged-particle beam, wherein scanning the charged-particle beam comprises adjusting a position of the primary optical axis of the charged-particle beam in relation to the secondary optical axis.

Other advantages of the embodiments of the present disclosure will become apparent from the following description taken in conjunction with the accompanying drawings wherein are set forth, by way of illustration and example, certain embodiments of the present invention.

DETAILED DESCRIPTION

Figure 1:
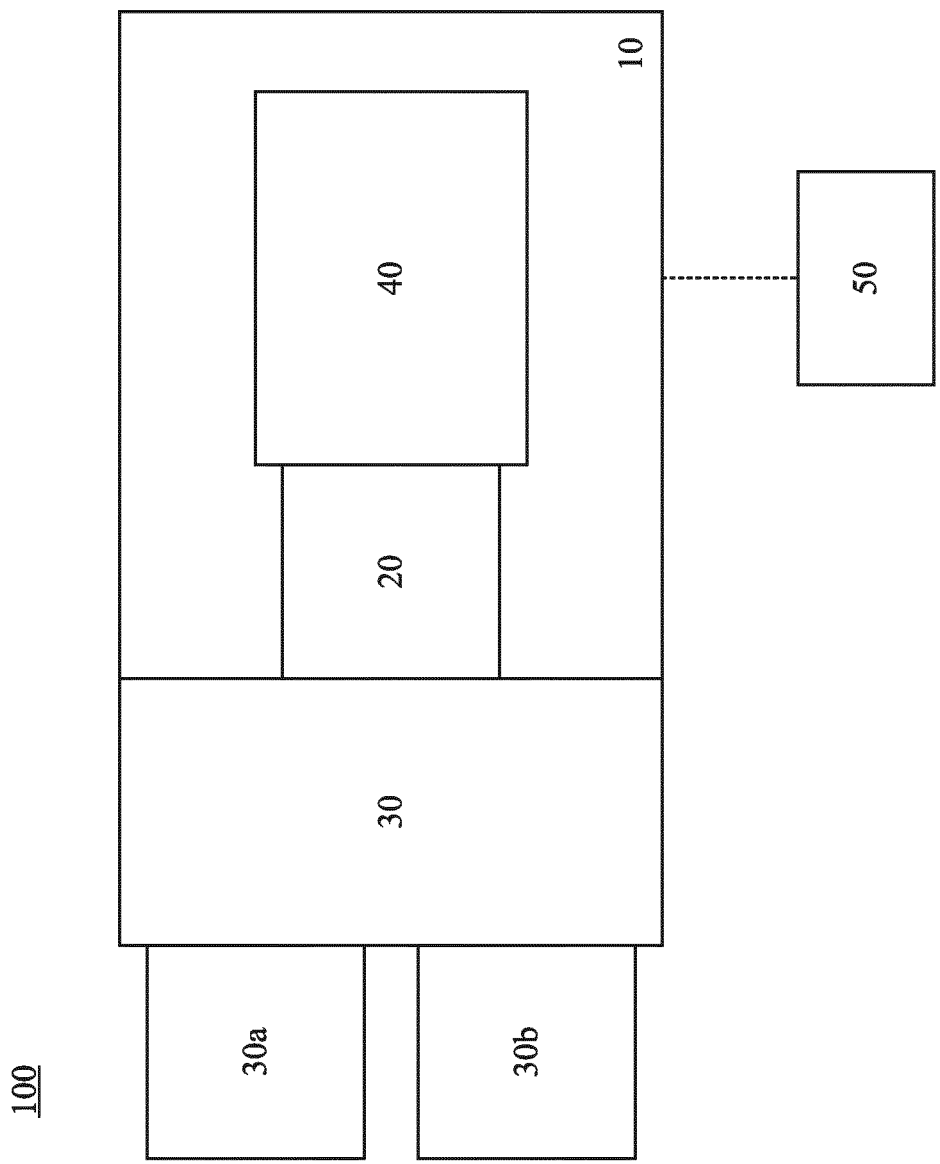
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims. For example, although some embodiments are described in the context of utilizing electron beams, the disclosure is not so limited. Other types of charged particle beams may be similarly applied. Furthermore, other imaging systems may be used, such as optical imaging, photo detection, x-ray detection, etc.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC, thereby rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). An SEM can be used to image these extremely small structures, in effect, taking a "picture" of the structures. The image can be used to determine if the structure was formed properly and also if it was formed in the proper location. If the structure is defective, then the process can be adjusted so the defect is less likely to recur.

The accuracy and reliability of inspection of high-density IC chips using SEMs may depend on the imaging resolution of the system, among other things. One of the several ways to obtain and maintain high imaging resolution is to periodically measure the characteristics of the electron beam used for inspection. Based on the measurements, the user or the system may adjust the beam characteristics, such as beam alignment or beam uniformity, to maintain the high resolution. Therefore, accurate measurements of beam characteristics while maintaining the high inspection throughput may be desirable.

In conventional SEMs, characteristics of a primary electron beam may be determined using an indirect or a direct beam profiling method. An indirect profiling method may include, among other things, acquiring an in-focus and an out-of-focus image of a feature or a region of the sample, and comparing the beam characteristics to determine the beam profile. One of the several challenges introduced by beam-sample interaction in indirect beam profiling may include charging or damage caused to the sample, which may influence the measurements.

Alternatively, an electron beam may be profiled directly using an electron detector, without sample interaction, thus avoiding the issues associated with beam-sample interaction. However, the resolution of the electron detectors may be inadequate to accurately measure characteristics of beams having a small size suitable for higher resolution. Although, an external field such as an electric or a magnetic field may be used to modify the profile of the electron beam to overcome the limitations of spatial resolution, the external fields may interfere with the fields created by and within the SEM, thus perturbing the normal probe formation process. In addition, imperfections in electric or magnetic fields may cause distortions in the modified beam profile, thus negatively impacting the accuracy of the determined beam characteristics. Therefore, it may be desirable to profile electron beams using a technique that avoids beam-sample interaction and overcomes resolution limitations of existing electron detectors, while maintaining the high inspection throughput.

In some embodiments of the present disclosure, a method of profiling an electron beam without beam-sample interaction while maintaining high resolution and throughput may include modifying the electron beam by adjusting an interaction between the electron beam and an optical beam such as, for example, a standing optical wave. The electron beam may be modified based on an interaction with the optical beam, and the modified electron beam may be detected using an electron detector. Modification of the electron beam may include magnification or truncation, for example. Alternatively, in some embodiments, the optical beam may be modified based on an interaction between the optical beam and the electron beam, and an optical detector may be used to detect photons of an optical signal from modified optical beams after interaction with the electron beam. The electron beam characteristics may be determined based on the detected electrons of the modified electron beam or based on the detected photons of the modified optical beam.

Relative dimensions of components in drawings may be exaggerated for clarity. Within the following description of drawings, the same or like reference numbers refer to the same or like components or entities, and only the differences with respect to the individual embodiments are described. As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 100 includes a main chamber 10, a load-lock chamber 20, an electron beam tool 40, and an equipment front end module (EFEM) 30. Electron beam tool 40 is located within main chamber 10. While the description and drawings are directed to an electron beam, it is appreciated that the embodiments are not used to limit the present disclosure to specific charged particles.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load-lock chamber 20.

Load-lock chamber 20 is connected to a load/lock vacuum pump system (not shown), which removes gas molecules in load-lock chamber 20 to reach a first pressure below the atmospheric pressure. After reaching the first pressure, one or more robot arms (not shown) transport the wafer from load-lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 40. In some embodiments, electron beam tool 40 may comprise a single-beam inspection tool. In other embodiments, electron beam tool 40 may comprise a multi-beam inspection tool.

Controller 50 may be electronically connected to electron beam tool 40 and may be electronically connected to other components as well. Controller 50 may be a computer configured to execute various controls of charged particle beam inspection system 100. Controller 50 may also include processing circuitry configured to execute various signal and image processing functions. While controller 50 is shown in FIG. 1 as being outside of the structure that includes main chamber 10, load-lock chamber 20, and EFEM 30, it is appreciated that controller 50 can be part of the structure.

While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
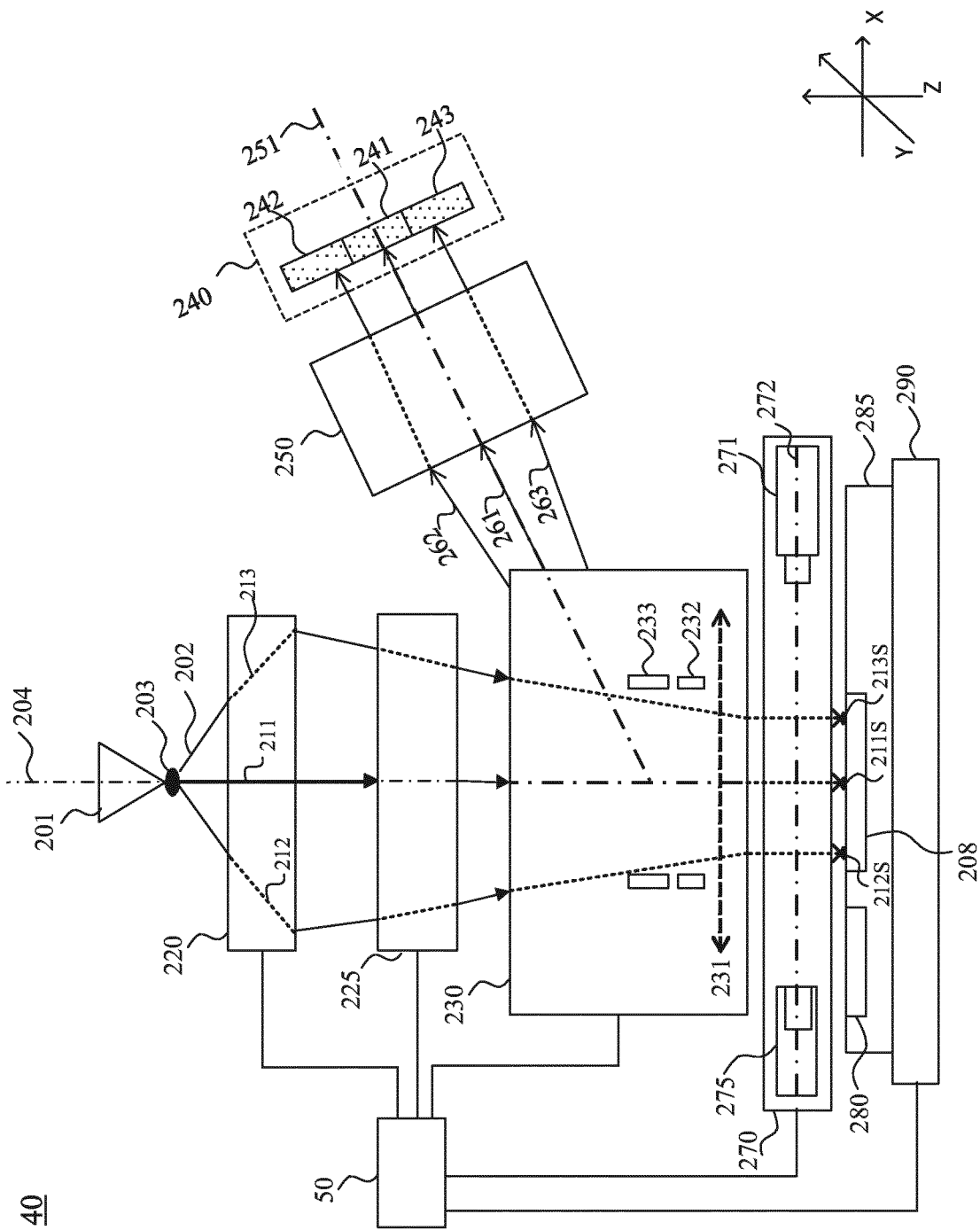
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool 40 that can be a part of the exemplary charged particle beam inspection system 100 of FIG. 1, consistent with embodiments of the present disclosure. Electron beam tool 40 (also referred to herein as apparatus 40) may comprise an electron source 201, a source conversion unit 220, a primary projection optical system 230, a secondary imaging system 250, and a secondary electron detection device 240. In some embodiments, electron beam tool 40 may further comprise an optical system 270 including an optical source 271 configured to generate an optical beam along a secondary optical axis 272, and an optical detector 275.

In some embodiments, electron beam tool 40 may include a motorized sample stage 290, a sample holder 285 to hold a sample 208 (e.g., a wafer, a specimen, or a photomask) and a primary electron detection device 280. Although not shown in FIG. 2, in some embodiments, electron beam tool 40 may further comprise a gun aperture plate, a pre-beamlet forming mechanism, and a condenser lens. It may be appreciated that other commonly known components of apparatus 40 may be added/omitted as appropriate.

Electron source 201, source conversion unit 220, deflection scanning unit 232, beam separator 233, and primary projection optical system 230 may be aligned with a primary optical axis 204 of apparatus 40. Secondary imaging system 250 and secondary electron detection device 240 may be aligned with a tertiary optical axis 251 of apparatus 40.

Electron source 201 may include a cathode, an extractor or an anode, wherein primary electrons can be emitted from the cathode and extracted or accelerated to form a primary electron beam 202 that forms a primary beam crossover (virtual or real) 203. Primary electron beam 202 can be visualized as being emitted from primary beam crossover 203.

Source conversion unit 220 may comprise an aperture lens array, a beam-limit aperture array, and an imaging lens. The aperture lens array may comprise an aperture-lens forming electrode plate and an aperture lens plate positioned below the aperture-lens forming electrode plate. In this context, "below" refers to the structural arrangement such that primary electron beam 202 traveling downstream from electron source 201 irradiates the aperture-lens forming electrode plate before the aperture lens plate. The aperture-lens forming electrode plate may be implemented via a plate having an aperture configured to allow at least a portion of primary electron beam 202 to pass through. The aperture lens plate may be implemented via a plate having a plurality of apertures traversed by primary electron beam 202 or multiple plates having plurality of apertures. The aperture-lens forming electrode plate and the aperture lens plate may be excited to generate electric fields above and below the aperture lens plate. The electric field above the aperture lens plate may be different from the electric field below the aperture lens plate so that a lens field is formed in each aperture of the aperture lens plate, and the aperture lens array may thus be formed.

In some embodiments, the beam-limit aperture array may comprise beam-limit apertures. It is appreciated that any number of apertures may be used, as appropriate. The beam-limit aperture array may be configured to limit diameters of individual primary beamlets 211, 212, and 213. Although FIG. 2 shows three primary beamlets 211, 212, and 213 as an example, however, it is appreciated that source conversion unit 220 may be configured to form any number of primary beamlets.

In some embodiments, an imaging lens may comprise a collective imaging lens configured to focus primary beamlets 211, 212, and 213 on an image plane. Imaging lens may have a principal plane orthogonal to primary optical axis 204. Imaging lens may be positioned below beam-limit aperture array and may be configured to focus primary beamlets 211, 212, and 213 such that the beamlets form a plurality of focused images of primary electron beam 202 on the intermediate image plane.

In some embodiments, electron beam tool 40 may comprise a beamlet control unit 225 configured to receive primary beamlets 211, 212, and 213 from source conversion unit 220 and direct them towards sample 208. Beamlet control unit 225 may include a transfer lens configured to direct primary beamlets 211, 212, and 213 from the image plane to the objective lens such that primary beamlets 211, 212, and 213 normally or substantially normally land on surface of sample 208, or form the plurality of probe spots 211S, 212S, and 213S with small aberrations. Transfer lens may be a stationary or a movable lens. In a movable lens, the focusing power of the lens may be changed by adjusting the electrical excitation of the lens.

In some embodiments, beamlet control unit 225 may comprise a beamlet tilting deflector configured to may be configured to tilt primary beamlets 211, 212, and 213 to obliquely land on the surface of sample 208 with same or substantially same landing angles (θ) with respect to the surface normal of sample 208. Tilting the beamlets may include shifting a crossover of primary beamlets 211, 212, and 213 slightly off primary optical axis 204. This may be useful in inspecting samples or regions of sample that include three-dimensional features or structures such as side walls of a well, or a trench, or a mesa structure.

In some embodiments, beamlet control unit 225 may comprise a beamlet adjustment unit configured to compensate for aberrations such as astigmatism and field curvature aberrations caused due to one or all of the lenses mentioned above. Beamlet adjustment unit may comprise an astigmatism compensator array, a field curvature compensator array, and a deflector array. The field curvature compensator array may comprise a plurality of micro-lenses to compensate field curvature aberrations of the primary beamlets 211, 212, and 213, and the astigmatism compensator array may comprise a plurality of micro-stigmators to compensate astigmatism aberrations of the primary beamlets 211, 212, and 213.

In some embodiments, the deflectors of the deflector array may be configured to deflect beamlets 211, 212, and 213 by varying angles towards primary optical axis 204. In some embodiments, deflectors farther away from primary optical axis 204 may be configured to deflect beamlets to a greater extent. Furthermore, deflector array may comprise multiple layers (not illustrated), and deflectors may be provided in separate layers. Deflectors may be configured to be individually controlled independent from one another. In some embodiments, a deflector may be controlled to adjust a pitch of probe spots (e.g., 211S, 212S, and 213S) formed on a surface of sample 208. As referred to herein, pitch of the probe spots may be defined as the distance between two immediately adjacent probe spots on the surface of sample 208. In some embodiments, the deflectors may be placed on the intermediate image plane.

Primary projection optical system 230 may comprise an objective lens 231, a deflection scanning unit 232, and a beam separator 233. Beam separator 233 and deflection scanning unit 232 may be positioned inside primary projection optical system 230. Objective lens 231 may be configured to focus beamlets 211, 212, and 213 onto sample 208 for inspection and can form three probe spots 211S, 212S, and 213S, respectively, on surface of sample 208. In some embodiments, beamlets 211, 212, and 213 may land normally or substantially normally on objective lens 231. In some embodiments, focusing by the objective lens may include reducing the aberrations of the probe spots 211S, 212S, and 213S.

In response to incidence of primary beamlets 211, 212, and 213 on probe spots 211S, 212S, and 213S on sample 208, electrons may emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213).

Electron beam tool 40 may comprise beam separator 233. Beam separator 233 may be of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 211, 212, and 213 is equal in magnitude and opposite in direction to the force exerted on the electron by magnetic dipole field B1. Beamlets 211, 212, and 213 can therefore pass straight through beam separator 233 with zero deflection angles.

Deflection scanning unit 232 may be configured to deflect beamlets 211, 212, and 213 to scan probe spots 211S, 212S, and 213S over three small scanned areas in a section of the surface of sample 208. Beam separator 233 may direct secondary electron beams 261, 262, and 263 towards secondary imaging system 250. Secondary imaging system 250 can focus secondary electron beams 261, 262, and 263 onto detection elements 241, 242, and 243 of secondary electron detection device 240.

Detection elements 241, 242, and 243 may be configured to detect corresponding secondary electron beams 261, 262, and 263 and generate corresponding signals used to construct images of the corresponding scanned areas of sample 208.

In FIG. 2, three secondary electron beams 261, 262, and 263 respectively generated by three probe spots 211S, 212S, and 213S, travel upward towards electron source 201 along primary optical axis 204, pass through objective lens 231 and deflection scanning unit 232 in succession. The three secondary electron beams 261, 262, and 263 are diverted by beam separator 233 (such as a Wien Filter) to enter secondary imaging system 250 along tertiary optical axis 251 thereof. Secondary imaging system 250 may focus the three secondary electron beams 261, 262, and 263 onto secondary electron detection device 240 which comprises three detection elements 241, 242, and 243. Therefore, secondary electron detection device 240 can simultaneously generate the images of the three scanned regions scanned by the three probe spots 211S, 212S, and 213S, respectively. In some embodiments, secondary electron detection device 240 and secondary imaging system 250 form one detection unit (not shown). In some embodiments, the electron optics elements on the paths of secondary electron beams such as, but not limited to, objective lens 231, deflection scanning unit 232, beam separator 233, secondary imaging system 250 and secondary electron detection device 240, may form one detection system.

In some embodiments, controller 50 may comprise an image processing system that includes an image acquirer (not shown) and a storage (not shown). The image acquirer may comprise one or more processors. For example, the image acquirer may comprise a computer, server, mainframe host, terminals, personal computer, any kind of mobile computing devices, and the like, or a combination thereof. While not shown in FIG. 2, the image acquirer may be communicatively coupled to secondary electron detection device 240 of apparatus 40 through a medium such as an electrical conductor, optical fiber cable, portable storage media, IR, Bluetooth, internet, wireless network, wireless radio, among others, or a combination thereof. In some embodiments, the image acquirer may receive a signal from secondary electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from secondary electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 50 may be configured to perform image processing steps with the multiple images of the same location of sample 208.

In some embodiments, controller 50 may include circuitry (e.g., analog-to-digital converters, amplifiers, resistors, timers) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 50 may be configured to control source conversion unit 220, beamlet control unit 225, and primary projection optical system 230, as illustrated in FIG. 2. Although not illustrated, controller 50 may be configured to control one or more components of electron beam tool 40 including, but not limited to, electron source 201 and components of source conversion unit 220, primary projection optical system 230, secondary electron detection device 240, and secondary imaging system 250. Although FIG. 2 shows that electron beam tool 40 uses three primary electron beamlets 211, 212, and 213, it is appreciated that electron beam tool 40 may use two or more primary electron beamlets. In some embodiments, electron beam tool 40 may comprise a single-beam tool configured to inspect a sample using one electron beam. In a single-beam configuration, some components, for example, beam deflection unit 233 may be irrelevant and therefore, can be removed, replaced, or deactivated. The present disclosure does not limit the number of primary electron beamlets used in apparatus 40.

In some embodiments, controller 50 may include circuitry to control operation of motorized stage 290 to move sample 208 during inspection. In some embodiments, controller 50 may enable motorized stage 290 to move sample 208 in a direction continuously at a constant speed. In other embodiments, controller 50 may enable motorized stage 290 to change the speed of the movement of sample 208 over time depending on the steps of scanning process. In some embodiments, controller 50 may adjust a configuration of primary projection optical system 230 or secondary imaging system 250 based on images of secondary electron beams 261, 262, and 263.

In some embodiments, sample holder 285 may be mounted on motorized stage 290 or disposed in a recess formed in motorized stage 290 such that movement of motorized stage 290 results in corresponding movement of sample holder 285. In some embodiments, sample holder 285 may be configured to hold one or more samples 208, and one or more primary electron devices 280.

In some embodiments, controller 50 may include circuitry and be configured to control operation of optical system 270 including, but is not limited to, activating optical source 271, generating an optical beam (which is further described below) along secondary optical axis 272, displacing the optical beam off of secondary optical axis 272, activating optical detector 275, receiving optical signals from optical detector 275, and the like.

Optical system 270 may comprise optical source 271 configured to generate an optical beam. In some embodiments, optical source 271 may comprise a source of photons including, but not limited to, a laser, a high intensity laser, or a monochromatic light source. Optical source 271 may be configured to be controlled by controller 50 or a processor (not illustrated) of optical system 270. Controlling optical source 271 may include, but is not limited to, activating the laser source, calibrating and stabilizing the laser source, directing the photons along an optical axis, etc.

In some embodiments, optical system 270, including optical source 271 and optical detector 275, may be disposed below primary projection optical system 230. In some embodiments, optical system 270, including optical source 271 and optical detector 275, may be disposed between objective lens 231 and sample 208. In other embodiments, optical system 270, including optical source 271 and optical detector 275, may be disposed at various other locations, such as locations where secondary optical axis 272 may cross the path of an electron beam, such as primary electron beam 202, beamlet 211, beamlet 212, or beamlet 213. Optical source 271 may be configured to generate an optical beam along secondary optical axis 272, perpendicular or substantially perpendicular to primary optical axis 204. In some embodiments, the optical beam may be generated in a plane perpendicular or substantially perpendicular to primary optical axis 204. For example, the optical beam may not perpendicularly intersect with primary electron beam 202, however, the plane along which the optical beam propagates may be perpendicular or substantially perpendicular to primary optical axis 204.

Optical system 270 may comprise optical detector 275 configured to receive an optical signal generated for example, after interaction of the optical beam with primary electron beam 202. In some embodiments, optical detector 275 may be configured to receive an optical signal directly from optical source 271 without interaction with an electron beam, for example, during optical beam intensity or positioning calibration. Optical detector 275 may be aligned with optical source 271 at least along one of the X-, Y-, or Z-axis. In some embodiments, optical detector 275 may be disposed on the same plane as optical source 271. In some embodiments, optical detector 275 may be disposed linearly or diametrically opposite to optical source 271 to optimize signal collection efficiency.

In some embodiments, optical detector 275 may comprise a photodetector, an array of photodetectors, a photomultiplier tube, or an array of photomultiplier tubes, among others. Controller 50 or the processor of optical system 270 may be configured to control optical detector 275. Controlling optical detector 275 may include, but is not limited to, activating the detector, calibrating the detector based on intensity and positioning, or communicating and receiving feedback signals from controller 50.

Figure 3:
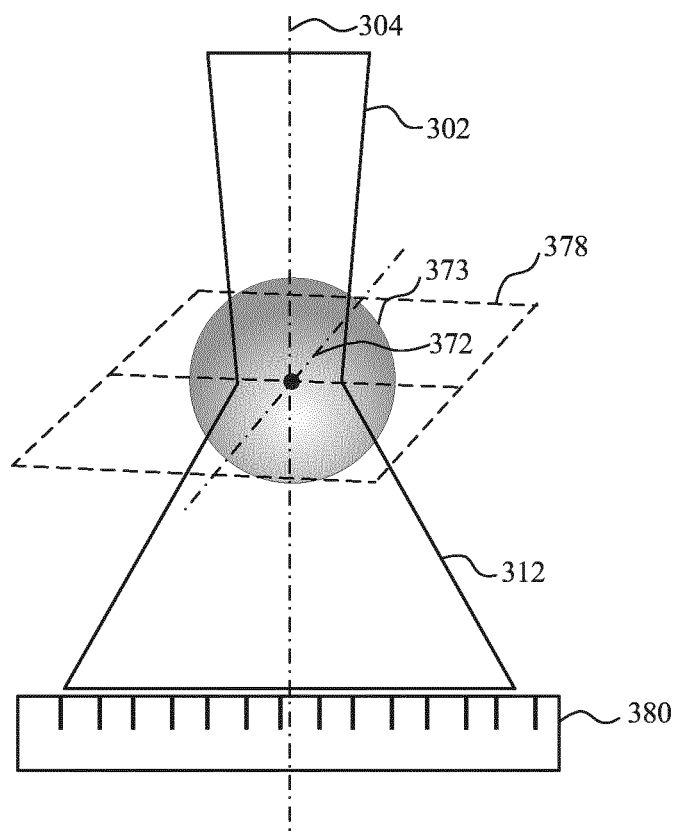
FIG. 3 is a schematic diagram illustrating an exemplary configuration of an optical beam and an electron beam in a single charged-particle beam system, consistent with embodiments of the present disclosure.

Reference is now made to FIG. 3, which is a schematic diagram illustrating an exemplary configuration 300 of an optical beam 373 and an electron beam 302 in a charged-particle beam system (e.g., electron beam tool 40 of FIG. 2 in a single-beam configuration), consistent with embodiments of the present disclosure.

In some embodiments, electron beam tool 40 may provide a mechanism to support multiple modes of operation. For example, electron beam tool 40 may be configured to operate in an "operation" mode to obtain high resolution images of sample 208 or regions of interest within sample 208, or a "measurement" mode to determine electron beam profile and beam characteristics. In some embodiments, electron beam tool 40 may be configured to switch between modes within an inspection scan based on the tool conditions, imaging resolution obtained, or desired analysis. For example, if electron beam tool 40 is analyzing a defect in the inspection mode and the required resolution is inadequate, the user may switch from the inspection mode to the measurement mode to determine whether the beam characteristics may be adjusted to enhance the imaging resolution.

In some embodiments, controller 50 may comprise a computer or a processor configured to execute various controls of electron beam tool 40. Controller 50 may be electronically connected to electron beam tool 40 and may include processing circuitry configured to execute various signal processing functions and generate various control signals to govern operations of electron beam tool 40. In some embodiments, controller 50 may be configured to switch between operation modes based on user input. Switching operation modes may include, but is not limited to, activating hardware components, executing software programs, and the like.

FIG. 3 illustrates an exemplary configuration of an optical beam and an electrical beam in a measurement mode of a single charged-particle beam system. It is to be appreciated that an electron beam tool (e.g., electron beam tool 40 of FIG. 2) may be configured to operate as a single beam system or a multi-beam system. In a measurement mode, a controller (e.g., controller 50 of FIG. 2) may be configured to control an optical system (e.g., optical system 270 of FIG. 2) and a stage (e.g., motorized stage 290 of FIG. 2) to enable profiling or a determination of a characteristic or characteristics of electron beam 302.

The interaction of a well-collimated charged-particle beam with a standing wave of light may cause diffraction of the charged particles, a phenomenon commonly known as Kapitza-Dirac (KD) effect in the field of atom optics. In comparison to diffraction of a laser beam by a mechanical grating, the particle beam plays the role of the incoming wave and the standing wave of light acts as a grating, highlighting the particle-wave duality. Apart from representing particle-wave duality, the diffracted charged particles are coherent, thus allowing for formation of diffraction peaks. The manipulation or modification of charged-particle beams using standing optical wave is analogous to manipulation of light waves with optical elements. The interaction of charged particles such as electrons, with photons of a standing optical wave to cause diffraction of the charged particles may be used to profile electron beams in a SEM. Using an optical field to profile electron beams may have numerous advantages over existing methods of using electric or magnetic fields in charged-particle beam systems. An optical field to determine electron beam characteristics may have some or all of the advantages discussed herein, among others.

i. Higher measurement accuracy—Existing methods of using electric or magnetic field may introduce errors in beam characteristic measurements because they may interfere with the electromagnetic fields produced within the system and perturb the normal probe-formation process. The optical fields do not interfere with the inherent fields of the system, thereby resulting in a higher beam characteristic measurement accuracy.

ii. Elimination of sample-induced errors—Existing indirect beam profiling methods depend on probe-sample interaction, among other things. The interaction of a sample with a probing beam may introduce several errors in beam profiling due to challenges such as sample charging, sample damage, sample reproducibility, and the like. Using optical fields may allow the user to avoid sample interaction, and therefore, eliminate sample-induced errors during electron beam profiling.

iii. System design flexibility—Existing electron detectors may suffer from inadequate spatial resolution, limiting their use in profiling electron beams having small beam size. The use of optical fields to profile electron beams may allow the user to use optical detectors, thus overcoming the challenges of limited spatial resolution of electron detectors. As a result, this may enhance system flexibility and reliability in determining and verifying optimized beam characteristics for high resolution imaging.

iv. Higher throughput—High beam measurement accuracy and design flexibility may result in higher inspection throughput while maintaining high resolution. The system may be configured to switch between an operation and a measurement mode based on a user input during wafer inspection without causing significant tool or operation related delays.

As illustrated in FIG. 3, in a single-beam configuration, an electron beam 302, analogous to primary beamlet 211 of FIG. 2, is directed towards electron detector 380 along a primary optical axis 304. Optical beam 373 is configured to interact with electron beam 302 and may be generated by an optical source (e.g., optical source 271 of FIG. 2) along secondary optical axis 372 perpendicular to electron beam 302, analogous to secondary optical axis 272 of FIG. 2. Secondary optical axis 372 may be visualized as extending in-and-out of the plane of the paper, depicted as Y-axis in FIG. 3. In some embodiments, electron beam 302 may comprise a stationary charged-particle beam with respect to optical beam 373. Magnified electron beam 312 may be formed after interaction between electron beam 302 and optical beam 373.

Based on an input from a user, controller 50 may enable the measurement mode or switch the mode of operation from inspection mode to measurement mode or from measurement mode to inspection mode. In measurement mode, controller 50 may activate the optical system to generate an optical beam 373 from the optical source, and may control movement of motorized stage (e.g., motorized stage 290 of FIG. 2) such that electron detector 380 is positioned to receive magnified electron beam 312. In some embodiments, controller 50 may be configured to deflect magnified electron beam 312 such that electron detector 380 may receive magnified electron beam 312.

In some embodiments, optical beam 373 may comprise a standing optical wave. In the context of this disclosure, a standing optical wave may comprise a stationary wave formed by the combination of two waves having equal frequency and amplitude, moving in opposite directions. In other words, a stationary wave or a standing wave is a wave that oscillates in time, but the peak amplitude profile does not move in space.

In some embodiments, optical beam 373 may be directed towards electron beam 302 along secondary optical axis 372 and in a Z-plane 378 perpendicular or substantially perpendicular to primary optical axis 304. For example, optical beam 373 projected along secondary optical axis 372 (e.g., Y-axis) may extend in-and-out of the paper and the circle representing optical beam 373 is a cross-section of optical beam 373 at a plane where primary and secondary optical axes intersect. In some embodiments, optical beam 373 may comprise an optical beam having a circular, substantially circular, or an elliptical cross-section. It is to be appreciated that though one optical beam is illustrated in FIG. 3, any number of optical beams may be used, and the characteristics (e.g., shape, frequency, amplitude, intensity, etc.) of each optical beam may be different.

In some embodiments, interaction between optical beam 373 and electron beam 302 may cause modification of electron beam 302 to form magnified electron beam 312. Modification of electron beam 302 may comprise magnification, truncation, demagnification, etc. In some embodiments, modification of electron beam 302 may comprise modification of a path, a position, a size, or an intensity of electron beam 302, among others. As shown in FIG. 3, electron beam 302 may be magnified after interaction with optical beam 373. A profile of magnified electron beam 312 may be adjusted by adjusting the interaction between electron beam 302 and optical beam 373. In some embodiments, adjusting the interaction between electron beam 302 and optical beam 373 may comprise adjusting a position of secondary optical axis 372 of optical beam 373 in relation to primary optical axis 304 of electron beam 302. For example, adjusting a position of secondary optical axis 372 to intersect or substantially intersect with primary optical axis 304 of electron beam 302 may cause magnification of electron beam 302, illustrated as magnified electron beam 312 in FIG. 3. In some embodiments, adjusting the interaction may comprise causing the charged-particle beam to interact with the standing optical wave, or causing a change in the interaction between the charged-particle beam and the standing optical wave, wherein causing the change in the interaction comprises changing from substantially no interaction to interaction between the charged-particle beam and the standing optical wave. In some embodiments, adjusting the interaction may comprise activating or deactivating the optical source, enabling, partially disabling, or disabling the optical source, as appropriate.

In SEMs, smaller beam size of the probing beams may result in higher imaging resolution, among other things, and high spatial resolution of electron detection devices may be desirable to resolve the small beams used. Though existing electron detection devices may suffer from limited spatial resolution, electron beams may be magnified to overcome the spatial resolution limitations of the electron detection devices. However, the electron beams are magnified using external electric or magnetic fields, which may interfere with the probe beam formation process, thus rendering the beam profile determination inaccurate and unreliable. Therefore, magnification of electron beam 302 by interaction with optical beam 372 may enable the use of electron detectors with limited spatial resolution, while avoiding external interference, thereby accurately determining beam profiles.

In some embodiments, magnification of electron beam 302 after interaction with optical beam 373 may be determined based on several factors including, but are not limited to, optical beam intensity, beam interaction, location of interaction along the Z-axis, optical and electron beam focus, etc. In the context of this disclosure, magnification of electron beam 302 may be referred to as a ratio of the diameter of magnified electron beam 312 incident on electron detector 380 to the diameter of electron beam 302 at a Z-plane 378 of intersection of primary optical axis 304 and secondary optical axis 372. In some embodiments, magnification ratio may depend on factors including, but are not limited to, electron beam focus, location of the measurement of beam size, diameter of the electron beam at the electron detector, etc. and may be a value ranging from 50 to 50,000.

In some embodiments, electron detector 380 may be configured to receive charged particles, such as electrons, from magnified electron beam 312. Electron detector 380 may be disposed coplanar or substantially coplanar with sample 208, such that a top surface of electron detector 380 and sample 208 are on the same plane along the Z-axis. In some embodiments, electron detector 380 may be disposed along a Z-plane between Z-plane 378 and sample 208. In such a case, electron detector 380 may be disposed on a micropositioning stage (not illustrated) and be introduced in and out of the path of magnified electron beam 312, for example. Other mechanisms of introducing electron detector for receiving charged particles from magnified electron beam 312 may be employed as well.

In some embodiments, electron detector 380 may comprise a semiconductor electron detection device such as a monolithic active pixel sensor fabricated with standard complementary metal oxide semiconductor (CMOS) technology, a scintillator, a pixelated scintillator, a charge-coupled device (CCD), a faraday cup, a spectrometer, an electron capture detector (ECD), and the like.

In some embodiments, determining beam characteristics using electron detector 380 may include, but is not limited to, determining uniformity of beam intensity, determining beam energy, beam positioning, beam focus, and the like. Based on the determination of beam characteristics, controller 50 may determine a profile of electron beam 302. Controller 50 may adjust settings of source 201, column optics, adjust electric or magnetic fields influencing path of electrons, or other relevant components to adjust beam characteristics for enhancing imaging resolution. Controller 50 may be configured to communicate with electron detector 380 to obtain information associated with magnified electron beam 312 and reconstruct the detected signals to generate beam profiles.

In some embodiments, electron detector 380 may be substantially similar or perform substantially similar functions as electron detector 280 of FIG. 2. In some embodiments, electron detector 380 may be positioned adjacent to and substantially coplanar with sample 208 such that it receives magnified electron beam 312. In some embodiments, sample holder 285 may be placed on motorized stage 290 such that electron detector 380 (analogous to electron detector 280) may receive electrons from magnified electron beam 312 after interaction with optical beam 373. In some embodiments, controller 50 may adjust the position of motorized stage 290 such that electron detector 380 placed on or within sample holder 285 (disposed on motorized stage 290) may receive electrons from magnified electron beam 312 after interaction with optical beam 373.

Figure 4:
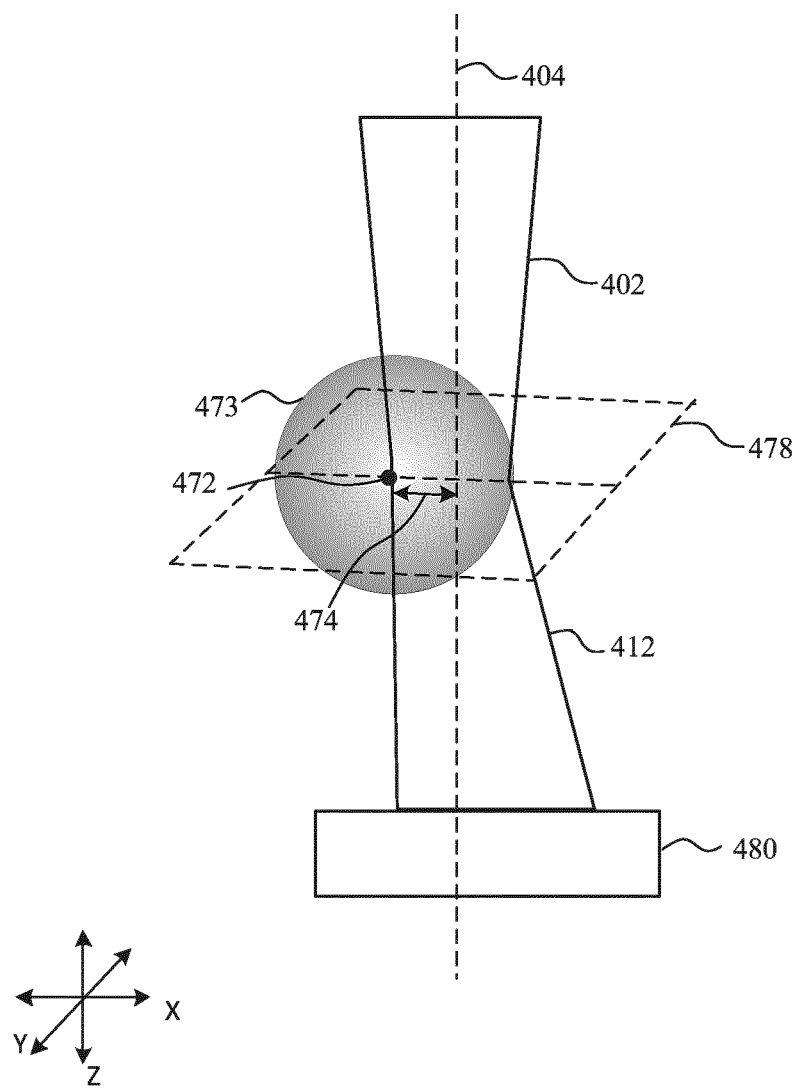
FIG. 4 is a schematic diagram illustrating an exemplary configuration of an optical beam and an electron beam in a single charged-particle beam system, consistent with embodiments of the present disclosure.

Reference is now made to FIG. 4, which is a schematic diagram illustrating an exemplary configuration 400 of an optical beam 473 and an electron beam 402 in a single charged-particle beam system (e.g., electron beam tool 40 of FIG. 2 in a single-beam configuration), consistent with embodiments of the present disclosure.

As illustrated in FIG. 4, in a single-beam configuration, an electron beam 402, analogous to primary electron beam 202 of FIG. 2 and electron beam 302 of FIG. 3, is directed towards electron detector 480 along a primary optical axis 404. Optical beam 473 is configured to interact with electron beam 402 and may be generated by an optical source (e.g., optical source 271 of FIG. 2) along secondary optical axis 472, analogous to secondary optical axis 272 of FIG. 2. Truncated electron beam 412 may be formed after interaction between electron beam 402 and optical beam 473. Based on an input from a user, controller 50 may enable the measurement mode or switch the mode of operation from inspection mode to measurement mode. In measurement mode, controller 50 may activate the optical system to generate an optical beam 473 from the optical source, and may control movement of motorized stage (e.g., motorized stage 290 of FIG. 2) such that electron detector 480 is positioned to receive truncated electron beam 412. Electron beam 402 may comprise a stationary charged-particle beam with respect to optical beam 473.

In some embodiments, as shown in FIG. 4, electron beam 402 may be truncated to form truncated electron beam 412 after interaction with optical beam 473. A profile of truncated electron beam 412 may be adjusted by adjusting the interaction between electron beam 402 and optical beam 473. In some embodiments, adjusting the interaction between electron beam 402 and optical beam 473 may comprise adjusting a position of secondary optical axis 472 of optical beam 473 in relation to primary optical axis 404 of electron beam 402.

In some embodiments, optical beam 473 may be displaced such that the interaction between optical beam 473 and electron beam 402 causes truncation of electron beam 402, as depicted by truncated electron beam 412. Optical beam 473 displaced from primary optical axis 404 such that secondary optical axis 472 and primary optical axis 404 do not intersect with each other, may act as a "knife-edge" to form truncated electron beam 412. Optical beam 473 may be displaced along Z-plane 478 or any other Z-plane such that secondary optical axis 472 is disposed on the Z-plane.

In some embodiments, optical beam 473 may be displaced by a distance 474 along X-axis such that secondary optical axis 472 may intersect with a portion of the periphery of electron beam 402. The position of secondary optical axis 472 may be adjusted to adjust the interaction between optical beam 473 and electron beam 402, and thereby modifying the profile of electron beam 402. In some embodiments, optical beam 473 may be displaced by distance 474 determined based on a desired profile of truncated electron beam 412. In some embodiments, sub-nanometer displacement of optical beam 473 off primary optical axis 404 may cause truncation of electron beam 402.

Figure 5:
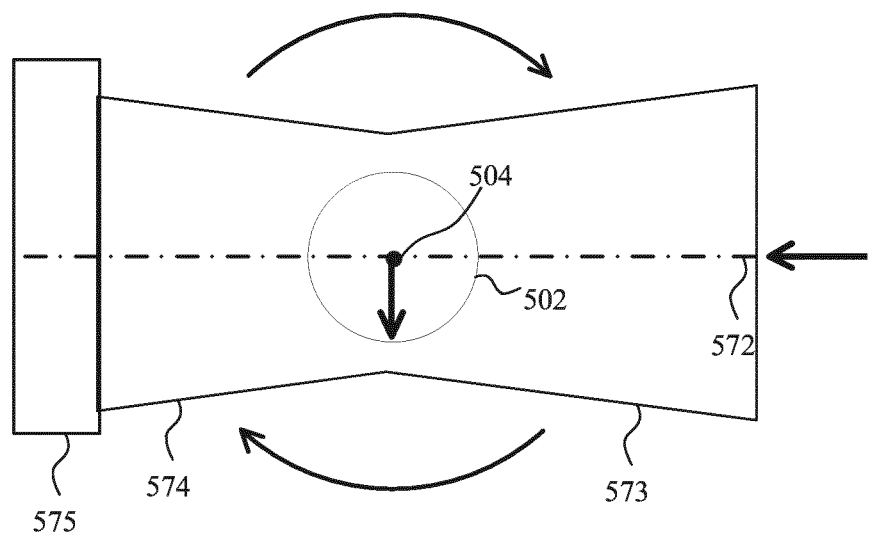
FIG. 5 is a schematic diagram illustrating an exemplary configuration of an optical beam and a scanning electron beam in a single charged-particle beam system, consistent with embodiments of the present disclosure.

Reference is now made to FIG. 5, which is a schematic diagram illustrating an exemplary configuration 500 of an optical beam 573 and a scanning electron beam 504 in a single charged-particle beam system, consistent with embodiments of the present disclosure. Optical beam 573 may be substantially similar to optical beam 373 of FIG. 3 and optical beam 473 of FIG. 4. In comparison to electron beam 302 of FIG. 3 and electron beam 402 of FIG. 4, electron beam 502 may comprise an electron beam configured to propagate in the Z-axis and scan in the X-axis.

In some embodiments, optical beam 573 may comprise an optical wave propagating in the Y-axis and configured to interact with electron beam 502. Interaction of electron beam 502 with optical beam 573 may cause modification of optical beam 573 to form modified optical beam 574. In some embodiments, modification of optical beam 573 may include, but is not limited to, modification in the optical beam intensity, optical beam path, optical beam size, and the like.

An optical detector 575 may be configured to receive optical signals comprising photons from modified optical beam 574 formed by the interaction of optical beam 573 with electron beam 502. In some embodiments, optical detector 575 may be aligned with the optical source along secondary optical axis 572. Optical detector 575 may comprise a photodetector, an array of photodetectors, or an array of photomultiplier tubes. In the measurement mode, controller 50 may activate optical source (e.g., optical source 271 of FIG. 2) and optical detector 575.

In some embodiments, interaction of optical beam 573 with electron beam 502 may result in modification of optical beam 573. For example, photons from optical beam 573 may be absorbed upon interaction with electrons from electron beam 502 such that the optical intensity or size of modified optical beam 574 is different from optical beam 573. Optical detector 575 may communicate the optical signals detected and be configured to communicate with controller 50 to determine characteristics of electron beam 502 based on the detected optical signals. Characteristics of electron beam 502 may include, but are not limited to, beam position, beam energy, beam intensity, beam path, uniformity in beam intensity, and the like.

In some embodiments, as illustrated in FIG. 5, the position of optical source (not illustrated) and optical detector 575 may be adjusted in the Y-axis while maintaining perpendicularity of secondary optical axis 572 to electron beam 502. Optical source and optical detector 575 may be rotatable around electrical beam 502 along the Y-axis. In some embodiments, the optical source and optical detector 575 may be disposed linearly opposite to each other such that optical detector 575 is configured to receive at least a portion of modified optical beam 574 while being aligned with optical source along the Y-axis. In some embodiments, optical source and optical detector 575 may be disposed diametrically opposite to each other such that optical detector 575 is configured to receive at least a portion of modified optical beam 574 while being aligned with optical source along the Y-axis.

Figure 6:
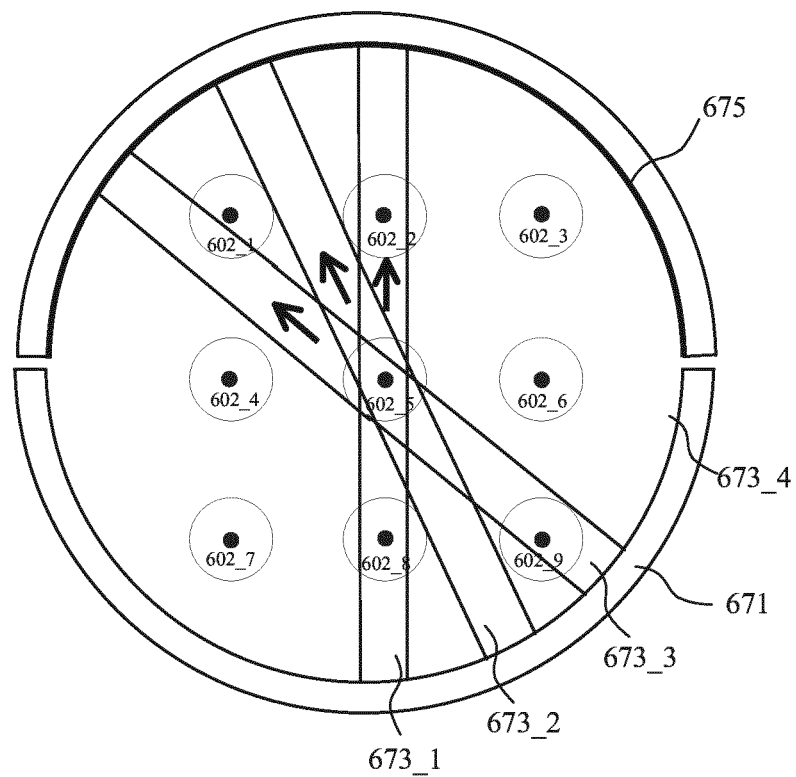
FIG. 6 is a schematic diagram illustrating an exemplary configuration of optical beams and electron beams in a multi-beam apparatus of FIG. 2, consistent with embodiments of the present disclosure.
Figure 6:
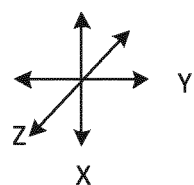

Reference is now made to FIG. 6, which is a schematic diagram illustrating an exemplary configuration 600 of a plurality of optical beams and a plurality of electron beams in a multi-beam apparatus of FIG. 2, consistent with embodiments of the present disclosure. As shown, configuration 600 of electron beam tool 40 may comprise an optical source 671, an optical detector 675, electron beams 602_1-602_9, and optical beams 673_1, 673_2, and 673_3. Although FIG. 6 illustrates nine electron beams and three optical beams, it is to be appreciated that any number of electron beams and optical beams may be used, as appropriate. In the measurement mode, one or more optical beams 673 may be generated and directed towards one or more electron beams 602. Interaction between optical beams and one or more electron beams may enable determining characteristics of one or more electron beams.

In some embodiments, determining a characteristic of one or more electron beams 602 may include determining alignment of more than one electron beam. For example, optical beam 673_1 may interact with electron beams 602_2, 602_5, and 602_8, and photons from optical beam after the interaction may be detected by optical detector 675. The optical beam intensity detected after interaction with electron beams 602_2, 602_5, and 602_8 may be compared with the intensity of optical beam 673_1 from optical source to determine the number of photons absorbed. Based on the difference in beam intensities or on the number of photons absorbed, controller 50 may determine alignment of electron beams 602_2, 602_5, and 602_8.

In some embodiments, an optical beam may be configured to interact with one electron beam of the system. For example, optical beam 673_2 may substantially interact with electron beam 602_5 to determine characteristics of electron beam 602_3. Such a configuration may be useful in determining the number of photons absorbed by a single electron beam.

In some embodiments, optical source 671 may comprise an array of light sources disposed in a semi-circular arrangement, as shown in FIG. 6. Optical source 671 may comprise an array of laser diodes configured to generate optical beams directed towards optical detector 675. Optical detector 675 may comprise an array of photodetectors disposed in a semi-circular arrangement. In some embodiments, optical detector 675 may comprise a monolithic photodetector configured to receive photons from optical beams 673_1, 673_2, and 673_3 after interaction with one or more electron beams 602_1-602_9. It is to be appreciated that an optical beam may not interact with an electron beam on its route towards optical detector 675. Such a configuration may be useful in calibrating a laser diode of optical source 671.

In some embodiments, optical source 671 and optical detector 675 may be rotatable along the Y-axis. In some embodiments, a photodetector of an array of photodetectors of optical detector 675 may be associated with a laser diode of the laser diode array of optical source 671. Although a photodetector may be configured to receive optical signals or photons from more than one optical beam after interaction with the electron beams; however, such a configuration may result in cross-talk and interferences resulting in inaccurate or unreliable measurements.

In some embodiments, laser diodes of the laser diode array may generate optical beams having similar or dissimilar wavelength, frequency, and amplitude. In some embodiments, laser diodes may be configured to generate optical beams having characteristics based on, for example, the application, a number of electron beams to be profiled, the arrangement of optical sources in relation to the arrangement of optical detectors, etc. In some embodiments, a position of a laser diode of the laser diode array may be adjusted to direct the optical beam so that the generated optical beam interacts with a predetermined number of electron beams. In some embodiments, the position of the laser diode may be fixed while the angle of projection of an optical beam may be adjusted so that the generated optical beam interacts with a predetermined number of electron beams.

In some embodiments, beam profiles of electron beams 602_1-602_9 may be determined based on the optical signals detected by optical detector 675. Beam profiles may be reconstructed by reconstructing the optical signals of the multiple photodetectors of the array of photodetectors of optical detector 675. Controller 50 may be configured to receive and process information from optical detector 675, to determine beam characteristics based on the information received, and to reconstruct beam profiles. Controller 50 or a processor of controller 50 may be configured to execute a software, a program, an algorithm, or a computer-implemented program to reconstruct beam profiles and communicate with the user.

Figure 7:
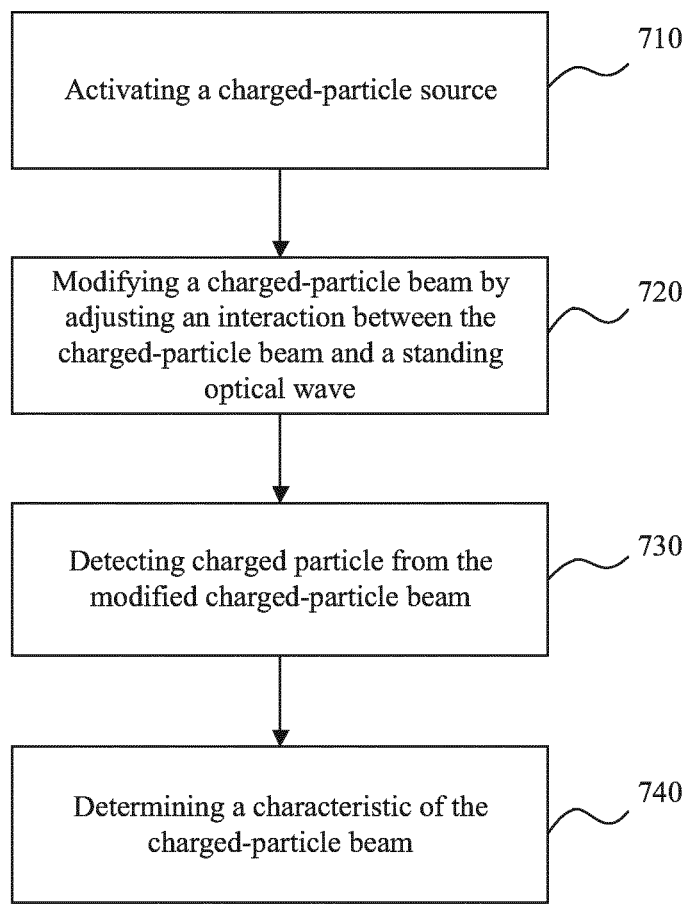
FIG. 7 is a process flowchart representing an exemplary method of profiling an electron beam, consistent with embodiments of the present disclosure.

Reference is now made to FIG. 7, which illustrates a flowchart representing an exemplary method 700 of profiling an electron beam, consistent with embodiments of the present disclosure. Method 700 may be performed by a controller (e.g., controller 50 of FIG. 1) of EBI system 100, as shown in FIG. 1, for example. The controller may be programmed to perform one or more blocks of method 700. For example, the controller may activate a charged-particle source, activate an optical system, and carry out other functions.

In step 710, a charged particle source (e.g., electron source 201 of FIG. 2) may be activated to generate a charged particle beam (e.g., primary electron beam 202 of FIG. 2). The electron source may be activated by a controller (e.g., controller 50 of FIG. 1). For example, the electron source may be controlled to emit primary electrons to form an electron beam along a primary optical axis (e.g., primary optical axis 204 of FIG. 2). The electron source may be activated remotely, for example, by using a software, an application, or a set of instructions for a processor of a controller to power the electron source through a control circuitry.

The EBI system may provide a mechanism to support multiple modes of operation. For example, electron beam tool (e.g., electron beam tool 40 of FIG. 1) may be configured to operate in an operation mode to obtain high resolution images of a sample or regions of interest within the sample, or a measurement mode to determine electron beam profile and beam characteristics. Electron beam tool may be configured to switch between modes within an inspection scan based on the tool conditions, imaging resolution obtained, desired analysis, and the like. For example, if the electron beam tool is analyzing a defect in the inspection mode, and the required resolution is inadequate, the user may switch from the inspection mode to the measurement mode to determine whether the beam characteristics may be adjusted to enhance the imaging resolution.

In step 720, in the measurement mode, the electron beam may be modified by adjusting an interaction between the electron beam and an optical beam (e.g., optical beam 273 of FIG. 3). The optical beam may comprise a standing optical wave and be generated by an optical source (e.g., optical source 271 of FIG. 2). The optical beam may be directed along a secondary optical axis (e.g. secondary optical axis 272 of FIG. 2) perpendicular to the primary optical axis. The optical beam may be directed towards the electron beam along the secondary optical axis and in a Z-plane (e.g., the Z-plane 378 of FIG. 3) perpendicular or substantially perpendicular to the primary optical axis. For example, the optical beam projected along the secondary optical axis may extend in-and-out of the paper and the circle representing the optical beam is a cross-section of the optical beam at a plane where primary and secondary optical axes intersect. In some embodiments, the optical beam may comprise an optical beam having a circular, substantially circular, or an elliptical cross-section.

In some embodiments, interaction between the optical beam and the electron beam may cause modification of the electron beam to form a modified electron beam (e.g., magnified electron beam 312 of FIG. 3). Modification of the electron beam may comprise magnification, truncation, demagnification, etc. In some embodiments, modification of electron beam may comprise modification of a path, a position, a size, or an intensity of the electron beam. The electron beam may be magnified after interaction with the optical beam. A profile of the magnified electron beam may be adjusted by adjusting the interaction between the electron beam and the optical beam. In some embodiments, adjusting the interaction between the electron beam and the optical beam may comprise adjusting a position of the secondary optical axis of the optical beam in relation to primary optical axis of the electron beam. For example, adjusting a position of the secondary optical axis to intersect or substantially intersect with the primary optical axis of the electron beam may cause magnification of electron beam.

Magnification of the electron beam after interaction with the optical beam may be determined based on several factors including, but are not limited to, optical beam intensity, beam interaction, location of interaction along the Z-axis, optical and electron beam focus, etc.

In some embodiments, interaction between the optical beam and the electron beam may cause truncation of the electron beam to form a modified electron beam. The optical beam may be displaced off primary optical axis such that the interaction between the optical beam and the electron beam causes truncation of electron beam. The optical beam displaced from primary optical axis such that the secondary optical axis and the primary optical axis do not intersect with each other may act as a "knife-edge" to form the truncated electron beam. The optical beam may be displaced along a Z-plane such that the secondary optical axis is disposed on the Z-plane.

The optical beam may be displaced by a distance (e.g., distance 474 of FIG. 4) along X-axis such that the secondary optical axis may intersect with a portion of the periphery of the electron beam. The position of secondary optical axis may be adjusted to adjust the interaction between the optical beam and the electron beam 402, and thereby modifying the profile of the electron beam.

In step 730, electrons from the modified electron beam may be detected using an electron detector (e.g., electron detector 380 of FIG. 3). Electron detector may be configured to receive charged particles such as electrons, from the magnified electron beam. Electron detector may be disposed coplanar or substantially coplanar with a sample (e.g., sample 208 of FIG. 2) such that a top surface of the electron detector and the sample are on the same plane along the Z-axis. Electron detector may be disposed along a plane between a Z-plane (e.g., Z-plane 378 of FIG. 3) and the sample. In such a case, the electron detector may be disposed on a micropositioning stage and be introduced in and out of the path of the magnified electron beam, for example. Other mechanisms of introducing electron detector for receiving charged particles from the magnified electron beam may be employed as well.

Electron detector may comprise a semiconductor electron detection device such as a monolithic active pixel sensor fabricated with standard complementary metal oxide semiconductor (CMOS) technology, a scintillator, a pixelated scintillator, a charge-coupled device (CCD), a faraday cup, a spectrometer, an electron capture detector (ECD), and the like.

In step 740, characteristics of the electron beam may be determined based on the detected electrons in step 730. Determining beam characteristics using the electron detector may include, but is not limited to, determining uniformity of beam intensity, determining beam energy, beam positioning, beam focus, and the like. Based on the determination of beam characteristics, the controller may determine the beam profile. Controller may also adjust source settings, column optics, adjust electric or magnetic fields influencing path of electrons, aberration corrections, or other relevant components to adjust beam characteristics for enhancing imaging resolution. Controller may be configured to communicate with the electron detector to obtain information associated with the modified electron beam and reconstruct the detected signals to generate beam profiles.

Figure 8:
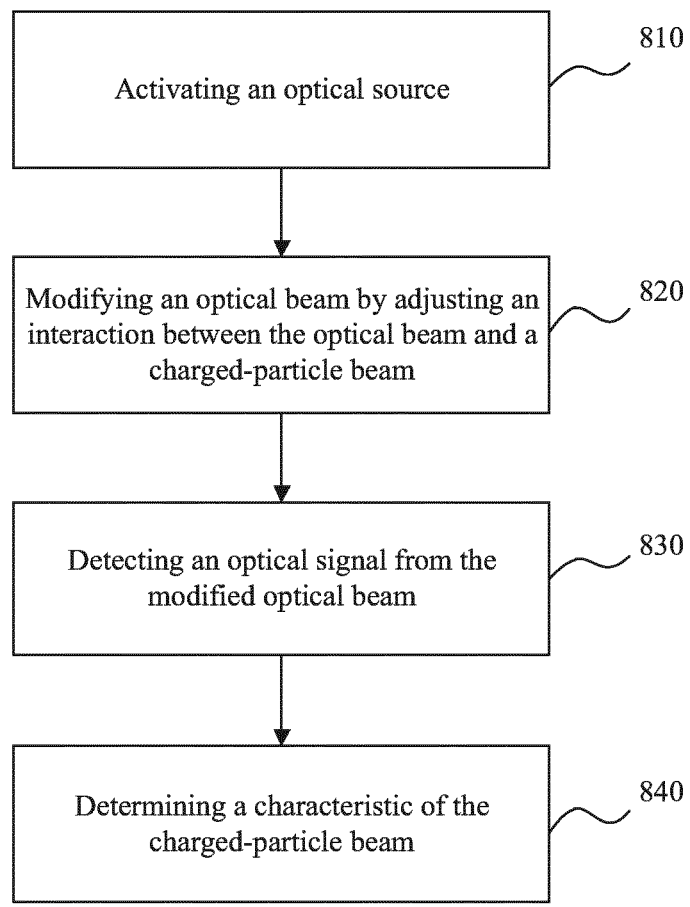
FIG. 8 is a process flowchart representing an exemplary method of profiling an electron beam, consistent with embodiments of the present disclosure.

Reference is now made to FIG. 8, which illustrates a flowchart representing an exemplary method 800 of profiling an electron beam, consistent with embodiments of the present disclosure. Method 800 may be performed by a controller (e.g., controller 50 of FIG. 1) of EBI system 100, as shown in FIG. 1, for example. The controller may be programmed to perform one or more blocks of method 800. For example, the controller may activate a charged-particle source, activate an optical system, and carry out other functions.

The EBI system may provide a mechanism to support multiple modes of operation. For example, electron beam tool (e.g., electron beam tool 40 of FIG. 1) may be configured to operate in an operation mode to obtain high resolution images of a sample or regions of interest within the sample, or a measurement mode to determine electron beam profile and beam characteristics. Electron beam tool may be configured to switch between modes within an inspection scan based on the tool conditions, imaging resolution obtained, desired analysis, and the like. For example, if the electron beam tool is analyzing a defect in the inspection mode, and the required resolution is inadequate, the user may switch from the inspection mode to the measurement mode to determine whether the beam characteristics may be adjusted to enhance the imaging resolution.

In step 810, an optical source (e.g., optical source 271 of FIG. 2) may be activated to generate an optical beam (e.g., optical beam 373 of FIG. 3). The optical source may be activated by the controller. For example, the optical source may be controlled to generate and emit photons to form the optical beam along a secondary optical axis (e.g., secondary optical axis 272 of FIG. 2). The optical source may be activated remotely, for example, by using a software, an application, or a set of instructions for a processor of a controller to power the electron source through a control circuitry.

Optical source may comprise a source of photons including, but not limited to, a laser, a high intensity laser, a laser diode, an array of laser diodes, or a monochromatic light source. Optical source may be configured to be controlled by the controller or a processor of an optical system (e.g., optical system 270 of FIG. 2). Controlling the optical source may include, but is not limited to, activating the laser source, calibrating and stabilizing the laser source, directing the photons along an optical axis, etc. The optical source and optical detector (e.g., optical detector 275 of FIG. 2), may be disposed between an objective lens (e.g., objective lens 231 of FIG. 2) and a sample (e.g., sample 208 of FIG. 2). The optical source may be configured to generate an optical beam along the secondary optical axis, perpendicular or substantially perpendicular to the primary optical axis. In some embodiments, the optical beam may be generated in a plane perpendicular or substantially perpendicular to the primary optical axis. For example, the optical beam may not perpendicularly intersect with the primary electron beam, however, the plane along which the optical beam propagates may be perpendicular or substantially perpendicular to the primary optical axis.

In step 820, the optical beam may be modified by adjusting an interaction between the optical beam and an electron beam (e.g., electron beam 202 and 302 of FIGS. 2 and 3). The electron beam may be generated by a charged-particle source (e.g., electron source 201 of FIG. 2). The electron source may be controlled to emit primary electrons to form the electron beam along a primary optical axis (e.g., primary optical axis 204 of FIG. 2). The electron source may be activated remotely, for example, by using a software, an application, or a set of instructions for a processor of a controller to power the electron source through a control circuitry.

The electron beam may be scanned in an axis such that the interaction with the optical beam varies with the scan. Interaction of the electron beam with the optical beam may cause the optical beam to be modified to form a modified optical beam (e.g., modified optical beam 574 of FIG. 5). In some embodiments, modification of the optical beam may include, but is not limited to, modification in the optical beam intensity, optical beam path, optical beam size, and the like. For example, photons from the optical beam may be absorbed upon interaction with electrons from the electron beam such that the optical intensity or size of the modified optical beam is different than the source optical beam.

In step 830, an optical signal may be detected from the modified optical beam using an optical detector (e.g., optical detector 575 of FIG. 5). The optical detector may be configured to receive optical signals comprising photons from modified optical beam formed by the interaction of the optical beam with the electron beam. The optical detector may communicate the optical signals detected and be configured to communicate with the controller to determine characteristics of the electron beam based on the detected optical signals. Characteristics of electron beam may include, but are not limited to, beam position, beam energy, beam intensity, beam path, uniformity in beam intensity, and the like.

The optical detector may be aligned with the optical source along the secondary optical axis. Optical detector may comprise a photodetector, an array of photodetectors, or an array of photomultiplier tubes.

In step 840, characteristics of the electron beam may be determined based on the detected optical signal in step 830. Determining electron beam characteristics using the optical detector may include, but is not limited to, determining uniformity of beam intensity, determining beam energy, beam positioning, beam focus, and the like. Based on the determination of beam characteristics, the controller may determine the beam profile. Controller may also adjust source settings, column optics, adjust electric or magnetic fields influencing path of electrons, aberration corrections, or other relevant components to adjust beam characteristics for enhancing imaging resolution. Controller may be configured to communicate with the electron detector to obtain information associated with the modified optical beam and reconstruct the detected signals to generate beam profiles.

The embodiments may further be described using the following clauses:

1. A method of profiling a charged-particle beam, the method comprising:
   activating a charged-particle source to generate the charged-particle beam along a primary optical axis;
   modifying the charged-particle beam by adjusting an interaction between the charged-particle beam and a standing optical wave;
   detecting, using a charged-particle detector, charged particles from the modified charged-particle beam after the interaction with the standing optical wave; and
   determining a characteristic of the charged-particle beam based on the detected charged particles.

2. The method of clause 1, further comprising generating, using an optical source, the standing optical wave in a plane perpendicular to the primary optical axis.

3. The method of any one of clauses 1 and 2, wherein modifying the charged-particle beam comprises modifying a path, a position, a size, or an intensity of the charged-particle beam.

4. The method of clause 3, wherein modifying the size of the charged-particle beam comprises one of magnifying or truncating the charged-particle beam.

5. The method of any one of clauses 1 to 4, wherein adjusting the interaction comprises adjusting a position of a secondary optical axis of the standing optical wave in relation to the primary optical axis.

6. The method of any one of clauses 1 to 5, wherein adjusting the interaction further comprises causing the charged-particle beam to interact with the standing optical wave.

7. The method of any one of clauses 1 to 6, wherein adjusting the interaction further comprises causing a change in the interaction between the charged-particle beam and the standing optical wave.

8. The method of clause 7, wherein causing the change in the interaction comprises changing from substantially no interaction to interaction between the charged-particle beam and the standing optical wave.

9. The method of any one of clauses 5 to 8, further comprising adjusting the position of the secondary optical axis to intersect with the primary optical axis.

10. The method of any one of clauses 5 to 9, wherein adjusting the position of the secondary optical axis to intersect with the primary optical axis causes magnification of the charged-particle beam.

11. The method of any one of clauses 5 to 10, wherein adjusting the position of the secondary optical axis further comprises displacing the standing optical wave such that the secondary optical axis intersects with a portion of a periphery of the charged-particle beam.

12. The method of clause 11, wherein displacing the standing optical wave to intersect the secondary optical axis with the portion of the periphery of the charged-particle beam causes truncation of the charged-particle beam.

13. The method of any one of clauses 1 to 12, wherein the charged-particle detector comprises a scintillator, a pixelated scintillator, a charge-coupled device, a faraday cup, a spectrometer, or an electron capture detector.

14. The method of any one of clauses 1 to 13, wherein the charged-particle detector is disposed substantially coplanar with a sample configured to receive the charged-particle beam.

15. The method of any one of clauses 1 to 14, wherein determining the characteristic comprises determining a profile of the charged-particle beam.

16. A charged-particle beam system comprising:
a charged-particle source to generate a charged-particle beam along a primary optical axis;
an optical source configured to generate a standing optical wave along a secondary optical axis; and
a controller having circuitry and configured to:
activate the optical source to generate the standing optical wave;
adjust an interaction between the charged-particle beam and the standing optical wave to modify the charged-particle beam;
activate a charged-particle detector to detect charged particles from the modified charged-particle beam after the interaction with the standing optical wave; and
determine a characteristic of the charged-particle beam based on the detected charged particles.

17. The system of clause 16, wherein the optical source is further configured to generate the standing optical wave in a plane perpendicular to the primary optical axis.

18. The system of any one of clauses 16 and 17, wherein modification of the charged-particle beam comprises modification of a path, a position, a size, or an intensity of the charged-particle beam.

19. The system of clause 18, wherein modification of the size of the charged-particle comprises magnification or truncation of the charged-particle beam.

20. The system of any one of clauses 16 to 19, wherein adjustment of the interaction comprises adjustment of a position of the secondary optical axis in relation to the primary optical axis.

21. The system of any one of clauses 16 to 20, wherein adjustment of the interaction further comprises adjustment of the position of the secondary optical axis to cause the charged-particle beam to interact with the standing optical wave.

22. The system of any one of clauses 16 to 21, wherein adjustment of the interaction further comprises adjustment of the position of the secondary optical axis to cause a change in the interaction between the charged-particle beam and the standing optical wave.

23. The system of clause 22, wherein the change in the interaction comprises a change from substantially no interaction to interaction between the charged-particle beam and the standing optical wave.

24. The system of any one of clauses 20 to 23, wherein the position of the secondary optical axis is adjusted to intersect with the primary optical axis.

25. The system of clause 24, wherein adjustment of the secondary optical axis to intersect with the primary optical axis causes magnification of the charged-particle beam.

26. The system of any one of clauses 20 to 25, wherein adjustment of the position of the secondary optical axis further comprises displacing the standing optical wave such that the secondary optical axis intersects with a portion of a periphery of the charged-particle beam.

27. The system of clause 26, wherein displacement of the standing optical wave to intersect the secondary optical axis with the portion of the periphery of the charged-particle beam causes truncation of the charged-particle beam.

28. The system of any one of clauses 16 to 27, wherein the charged-particle detector comprises a scintillator, a pixelated scintillator, a charge-coupled device, a faraday cup, a spectrometer, or an electron capture detector.

29. The system of any one of clauses 16 to 28, wherein the charged-particle detector is disposed between an objective lens and a sample configured to receive the charged-particle beam.

30. The system of clause 29, wherein the charged-particle detector is disposed substantially coplanar with the sample.

31. The system of any one of clauses 16 to 30, wherein determination of the characteristic comprises determination of a profile of the charged-particle beam.

32. A method of profiling a charged-particle beam, the method comprising:
activating an optical source to generate an optical beam;
modifying the optical beam by adjusting an interaction between the optical beam and the charged-particle beam generated by a charged-particle source;
detecting, using an optical detector, an optical signal from the modified optical beam after the interaction with the charged-particle beam; and
determining a characteristic of the charged-particle beam based on the detected optical signal.

33. The method of clause 32, further comprising activating a charged-particle source to generate the charged-particle beam along a primary optical axis.

34. The method of clause 33, comprising directing the optical beam along a secondary optical axis in a first plane perpendicular to the primary optical axis.

35. The method of any one of clauses 32 to 34, wherein modifying the optical beam comprises modifying a path, a position, a size, or an intensity of the optical beam.

36. The method of clause 35, wherein modifying the size of the optical beam comprises magnification or truncation of the optical beam.

37. The method of any one of clauses 32 to 36, further comprising scanning the charged-particle beam through the optical beam to adjust the interaction between the optical beam and the charged-particle beam.

38. The method of clause 37, comprising scanning the charged-particle beam through the optical beam along a second plane perpendicular to a secondary optical axis of the optical beam.

39. The method of clause 38, wherein scanning the charged-particle beam comprises adjusting a position of the primary optical axis of the charged-particle beam in relation to the secondary optical axis.

40. The method of clause 39, wherein scanning the charged-particle beam further comprises adjusting the position of the primary optical axis to intersect with the secondary optical axis.

41. The method of any one of clauses 32 to 40, wherein adjusting the interaction further comprises causing the optical beam to interact with the charged-particle beam.

42. The method of any one of clauses 32 to 41, wherein adjusting the interaction further comprises causing a change in the interaction between the optical beam and the charged-particle beam.

43. The method of clause 42, wherein causing the change in the interaction comprises changing from substantially no interaction to interaction between the optical beam and the charged-particle beam.

44. The method of clause 43, wherein adjusting the position of the primary optical axis to intersect with the secondary optical axis causes magnification of the optical beam.

45. The method of any one of clauses 39 to 44, wherein scanning the charged-particle beam further comprises adjusting the position of the primary optical axis to intersect with a periphery of the optical beam.

46. The method of clause 45, wherein adjusting the position of the primary optical axis of the charged-particle beam to intersect with a periphery of the optical beam causes truncation of the optical beam.

47. The method of any one of clauses 34 to 46, wherein a position of the optical source is adjustable in the first plane.

48. The method of any one of clauses 34 to 47, wherein a position of the optical detector is adjustable in the first plane and configured to detect the optical signal from the modified optical beam after interaction with the charged-particle beam.

49. The method of any one of clauses 32 to 48, wherein determining the characteristic comprises determining a profile of the charged-particle beam.

50. A charged-particle beam system comprising:
  a charged-particle source to generate a charged-particle beam along a primary optical axis;
  an optical source configured to generate an optical beam along a secondary optical axis; and
  a controller having circuitry and configured to:
    activate the optical source to generate the optical beam;
    adjust an interaction between the charged-particle beam and the optical beam to modify the optical beam;
    activate an optical detector to detect an optical signal from the modified optical beam after the interaction with the charged-particle beam; and determine a characteristic of the charged-particle beam based on the detected optical signal.

51. The system of clause 50, wherein the controller is further configured to direct the optical beam in a first plane perpendicular to the primary optical axis.

52. The system of any one of clauses 50 and 51, wherein modification of the optical beam comprises modification of a path, a position, a size, or an intensity of the optical beam.

53. The system of clause 52, wherein modification of the size of the optical beam comprises magnification or truncation of the optical beam.

54. The system of any one of clauses 50 to 53, wherein the controller is further configured to scan the charged-particle beam through the optical beam to adjust the interaction between the optical beam and the charged-particle beam.

55. The system of any one of clauses 50 to 54, wherein the controller is further configured to scan the charged-particle beam through the optical beam along a second plane perpendicular to the secondary optical axis of the optical beam.

56. The system of any one of clauses 50 to 55, wherein the controller is further configured to scan the charged-particle beam to adjust a position of the primary optical axis of the charged-particle beam in relation to the secondary optical axis.

57. The system of any one of clauses 50 to 56, wherein the controller is further configured to scan the charged-particle beam to adjust the position of the primary optical axis to intersect with the secondary optical axis.

58. The system of any one of clauses 50 to 57, wherein adjustment of the interaction further comprises adjustment of a position of the secondary optical axis to cause the optical beam to interact with the charged-particle beam.

59. The system of clause 58, wherein adjustment of the interaction further comprises adjustment of the position of the secondary optical axis to cause a change in the interaction between the optical beam and the charged-particle beam.

60. The system of clause 59, wherein the change in the interaction comprises a change from substantially no interaction to interaction between the optical beam and the charged-particle beam.

61. The system of any one of clauses 57 to 60, wherein adjustment of the position of the primary optical axis to intersect with the secondary optical axis causes magnification of the optical beam.

62. The system of any one of clauses 50 to 61, wherein the controller is further configured to scan the charged-particle beam to adjust the position of the primary optical axis to intersect with a periphery of the optical beam.

63. The system of clause 62, wherein adjustment of the position of the primary optical axis of the charged-particle beam to intersect with the periphery of the optical beam causes truncation of the optical beam.

64. The system of any one of clauses 50 to 63, wherein a position of the optical source is adjustable in the first plane.

65. The system of any one of clauses 50 to 64, wherein a position of the optical detector is adjustable in the first plane and configured to detect the optical signal from the modified optical beam after interaction with the charged-particle beam.

66. The system of any one of clauses 50 to 65, wherein determination of the characteristic comprises determination of a profile of the charged-particle beam.

67. A multi-beam apparatus comprising:
  a controller having circuitry and configured to: activate a charged-particle source to generate a primary charged-particle beam and to form a plurality of charged-particle beams therefrom;
  activate an optical source to generate a plurality of optical beams; adjust an interaction between at least one of the plurality of optical beams and one of the plurality of charged-particle beams to modify the at least one of the plurality of optical beams;
  activate an optical detector to detect an optical signal from the at least one of the plurality of optical beams modified after the interaction with one of the plurality of charged-particle beams; and
  reconstruct the optical signal to determine a characteristic of the one of the plurality of charged-particle beams.

68. The system of clause 67, wherein the optical source comprises an array of laser diodes.

69. The system of any one of clauses 67 and 68, wherein the optical detector comprises a photodetector, an array of photodetectors, or an array of photomultiplier tubes.

70. The system of any one of clauses 68 and 69, wherein a photodetector of the array of photodetectors is associated with a laser diode of the array of laser diodes.

71. The system of any one of clauses 67 to 70, wherein modification of the at least one of the plurality of optical beams comprises modification of a path, a position, a size, or an intensity of the at least one of the plurality of optical beams.

72. The system of clause 71, wherein modification of the size of the at least one of the plurality of optical beams comprises magnification or truncation of the at least one of the plurality of optical beams.

73. The system of any one of clauses 67 to 72, wherein the optical detector and the optical source are disposed radially in a plane perpendicular to a primary optical axis of the primary charged-particle beam.

74. The system of any one of clauses 67 to 73, wherein the optical detector is configured to receive a plurality of optical signals generated by the interaction of the plurality of optical beams and the plurality of charged-particle beams.

75. The system of any one of clauses 67 to 74, wherein determination of the characteristic comprises determination of a profile of the charged-particle beam.

76. A non-transitory computer readable medium storing a set of instructions that is executable by one or more processors of a charged particle beam apparatus to cause the charged particle beam apparatus to perform a method of profiling a charged-particle beam, the method comprising:
activating a charged-particle source to generate the charged-particle beam along a primary optical axis;
modifying the charged-particle beam by adjusting an interaction between the charged-particle beam and a standing optical wave;
activating a charged-particle detector to detect charged particles from the modified charged-particle beam after the interaction with the standing optical wave; and
determining a characteristic of the charged-particle beam based on the detected charged particles.

77. The non-transitory computer readable medium of clause 76, wherein the set of instructions executable by the one or more processors of the charged-particle beam apparatus to cause the charged-particle beam apparatus to further perform:
adjusting a position of a secondary optical axis of the standing optical wave in relation to the primary optical axis, wherein:
adjusting the position of the secondary optical axis to intersect with the primary optical axis causes magnification of the charged-particle beam; and
displacing the standing optical wave to intersect the secondary optical axis with a portion of a periphery of the charged-particle beam causes truncation of the charged-particle beam.

78. A non-transitory computer readable medium storing a set of instructions that is executable by one or more processors of a charged particle beam apparatus to cause the charged particle beam apparatus to perform a method of profiling a charged-particle beam, the method comprising:
activating an optical source to generate an optical beam;
modifying the optical beam by adjusting an interaction between the optical beam and the charged-particle beam generated by a charged-particle source;
detecting, using an optical detector, an optical signal from the modified optical beam after the interaction with the charged-particle beam; and
determining a characteristic of the charged-particle beam based on the detected optical signal.

79. The non-transitory computer readable medium of clause 78, wherein the set of instructions executable by the one or more processors of the charged-particle beam apparatus to cause the charged-particle beam apparatus to further perform:
scanning the charged-particle beam through the optical beam to adjust the interaction between the optical beam and the charged-particle beam, wherein scanning the charged-particle beam comprises adjusting a position of the primary optical axis of the charged-particle beam in relation to the secondary optical axis.

80. A method of profiling a plurality of charged-particle beams of a multi-beam system, the method comprising:
activating an optical source to generate a plurality of optical beams;
modifying the optical beams by adjusting an interaction between the optical beams and a plurality of charged-particle beams generated by a charged-particle source;
detecting, using an optical detector, optical signals from the modified optical beams after the interactions with the charged-particle beams; and
determining a characteristic of each of the charged-particle beams based on the detected optical signals.

81. The method of claim 80, wherein the optical source comprises a plurality of optical sources, wherein the charged particle source comprises a plurality of charged particle sources, or wherein the optical detector comprises a plurality of optical detectors.

A non-transitory computer readable medium may be provided that stores instructions for a processor of a controller (e.g., controller 50 of FIG. 1) to carry out image inspection, image acquisition, activating charged-particle source, activating optical system, activating optical source and optical detector, receive and process detected signals from the electron and photon detectors, moving the sample stage to adjust the position of the sample, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. A method of profiling a charged-particle beam, the method comprising:
   activating a charged-particle source to generate the charged-particle beam along a primary optical axis;
   modifying the charged-particle beam by adjusting an interaction between the charged-particle beam and a standing optical wave;
   detecting, using a charged-particle detector, charged particles from the modified charged-particle beam after the interaction with the standing optical wave; and
   determining a characteristic of the charged-particle beam based on the detected charged particles,
      wherein the charged-particle detector is placed substantially coplanar with a sample configured to receive the charged-particle beam.

2. A charged-particle beam system comprising:
   a charged-particle source to generate a charged-particle beam along a primary optical axis;
   a charged-particle detector positioned substantially coplanar with a sample configured to receive the charged-particle beam;
   an optical source configured to generate a standing optical wave along a secondary optical axis; and
   a controller having circuitry and configured to:
      activate the optical source to generate the standing optical wave;
      adjust an interaction between the charged-particle beam and the standing optical wave to modify the charged-particle beam;
      activate the charged-particle detector to detect charged particles from the modified charged-particle beam after the interaction with the standing optical wave; and
      determine a characteristic of the charged-particle beam based on the detected charged particles.

3. The system of claim 2, wherein the optical source is further configured to generate the standing optical wave in a plane perpendicular to the primary optical axis.

4. The system of claim 2, wherein modification of the charged-particle beam comprises modification of a path, a position, a size, or an intensity of the charged-particle beam.

5. The system of claim 4, wherein modification of the size of the charged-particle comprises magnification or truncation of the charged-particle beam.

6. The system of claim 2, wherein adjustment of the interaction comprises adjustment of a position of the secondary optical axis in relation to the primary optical axis.

7. The system of claim 6, wherein the position of the secondary optical axis is adjusted to intersect with the primary optical axis.

8. The system of claim 7, wherein adjustment of the secondary optical axis to intersect with the primary optical axis causes magnification of the charged-particle beam.

9. The system of claim 6, wherein adjustment of the position of the secondary optical axis further comprises displacing the standing optical wave such that the secondary optical axis intersects with a portion of a periphery of the charged-particle beam.

10. The system of claim 9, wherein displacement of the standing optical wave to intersect the secondary optical axis with the portion of the periphery of the charged-particle beam causes truncation of the charged-particle beam.

11. The system of claim 2, wherein adjustment of the interaction further comprises adjustment of the position of the secondary optical axis to cause the charged-particle beam to interact with the standing optical wave.

12. The system of claim 2, wherein adjustment of the interaction further comprises adjustment of the position of the secondary optical axis to cause a change in the interaction between the charged-particle beam and the standing optical wave.

13. The system of claim 12, wherein the change in the interaction comprises a change from substantially no interaction to interaction between the charged-particle beam and the standing optical wave.

14. The system of claim 2, wherein the charged-particle detector comprises a scintillator, a pixelated scintillator, a charge-coupled device, a faraday cup, a spectrometer, or an electron capture detector.

15. A non-transitory computer readable medium storing a set of instructions that is executable by one or more processors of a charged particle beam apparatus to cause the charged particle beam apparatus to perform a method of profiling a plurality of charged-particle beams of a multibeam system, the method comprising:
   activating an optical source to generate a plurality of optical beams;
   modifying the optical beams by adjusting an interaction between the optical beams and a plurality of charged-particle beams generated by a charged-particle source;
   detecting, using an optical detector, optical signals from the modified optical beams after the interactions with the charged-particle beams; and
   determining a characteristic of each of the charged-particle beams based on the detected optical signals.

16. The computer readable medium of claim 15, wherein the method further comprises:
   activating a charged-particle source to generate the charged-particle beam along a primary optical axis.

17. The computer readable medium of claim 16, wherein the method further comprises:
   directing the optical beam along a secondary optical axis in a first plane perpendicular to the primary optical axis.

18. The computer readable medium of claim 15, wherein modifying the optical beam comprises modifying a path, a position, a size, or an intensity of the optical beam.

19. The computer readable medium of claim 18, wherein modifying the size of the optical beam comprises magnification or truncation of the optical beam.

20. The computer readable medium of claim 15, wherein the method further comprises:
   scanning the charged-particle beam through the optical beam to adjust the interaction between the optical beam and the charged-particle beam.

* * * * *